(12) United States Patent
Moriya

(10) Patent No.: US 9,484,538 B2
(45) Date of Patent: Nov. 1, 2016

(54) MANUFACTURING METHOD OF ORGANIC SEMICONDUCTOR FILM, ORGANIC SEMICONDUCTOR FILM, THIN FILM TRANSISTOR, ACTIVE MATRIX DEVICE, ELECTRO-OPTICAL DEVICE, AND ELECTRONIC DEVICE

(71) Applicant: Seiko Epson Corporation, Tokyo (JP)

(72) Inventor: Soichi Moriya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/629,288

(22) Filed: Feb. 23, 2015

(65) Prior Publication Data

US 2015/0249216 A1 Sep. 3, 2015

(30) Foreign Application Priority Data

Feb. 28, 2014 (JP) ................. 2014-039973

(51) Int. Cl.
*H01L 51/00* (2006.01)
*H01L 51/05* (2006.01)
*H01L 51/50* (2006.01)

(52) U.S. Cl.
CPC ......... *H01L 51/0039* (2013.01); *H01L 51/004* (2013.01); *H01L 51/0007* (2013.01); *H01L 51/0036* (2013.01); *H01L 51/0038* (2013.01); *H01L 51/0508* (2013.01); *H01L 51/5004* (2013.01)

(58) Field of Classification Search
CPC .......... H01L 51/0039; H01L 51/0036; H01L 51/004; H01L 51/0007; H01L 51/0038; H01L 51/5004; H01L 51/0508
See application file for complete search history.

(56) References Cited

U.S. PATENT DOCUMENTS

2008/0076204 A1 3/2008 Yoon et al.
2013/0009137 A1* 1/2013 Brown ................... C08L 65/00
257/40

FOREIGN PATENT DOCUMENTS

JP 2004-006782 A 1/2004
JP 2007-180463 A 7/2007
JP 2008-078655 A 4/2008

* cited by examiner

*Primary Examiner* — Kyoung Lee
(74) *Attorney, Agent, or Firm* — ALG Intellectual Property, LLC

(57) ABSTRACT

A manufacturing method of an organic semiconductor film according to the invention includes applying a liquid composition in which an organic semiconductor material is dissolved or dispersed in a first solvent onto a base material in a predetermined pattern, applying a second solvent in which solubility of the organic semiconductor material is lower than that in the first solvent onto a region of the base material having the liquid composition applied thereto, and removing the second solvent.

22 Claims, 7 Drawing Sheets

MANUFACTURING METHOD OF ORGANIC SEMICONDUCTOR FILM, ORGANIC SEMICONDUCTOR FILM, THIN FILM TRANSISTOR, ACTIVE MATRIX DEVICE, ELECTRO-OPTICAL DEVICE, AND ELECTRONIC DEVICE

BACKGROUND

1. Technical Field

The present invention relates to a manufacturing method of an organic semiconductor film, an organic semiconductor film, a thin film transistor, an active matrix device, an electro-optical device, and an electronic device.

2. Related Art

Recently, as a device which is able to be substituted for a thin film transistor using an inorganic semiconductor material, a thin film transistor using an organic semiconductor material has received attention (for example, refer to JP-A-2004-6782).

The thin film transistor is able to form an organic semiconductor layer by using a liquid phase process in which high temperature and high vacuum are not necessary.

However, in the related art, stability of a solution of the organic semiconductor material which is used in the liquid phase process is low. For this reason, a solid content in the solution is precipitated or aggregated at the time of preservation, and thus an involuntary variation in properties or the like occurs on the organic semiconductor film to be manufactured. In particular, when the solution is ejected by using an ink jet method, nozzle clogging remarkably occurs, and thus the problem described above becomes remarkable, and productivity and yield of the organic semiconductor film remarkably decrease.

SUMMARY

An advantage of some aspects of the invention is to provide a manufacturing method of an organic semiconductor film which is able to manufacture an organic semiconductor film stably having excellent properties such as carrier mobility over a long period of time, to provide an organic semiconductor film having excellent properties such as carrier mobility, to provide a thin film transistor including an organic semiconductor film having excellent properties such as carrier mobility, to provide an active matrix device including an organic semiconductor film having excellent properties such as carrier mobility, to provide an electro-optical device including an organic semiconductor film having excellent properties such as carrier mobility, and to provide an electronic device including an organic semiconductor film having excellent properties such as carrier mobility.

The advantage described above will be attained by the following aspects of the invention.

According to an aspect of the invention, there is provided a manufacturing method of an organic semiconductor film including applying a liquid composition in which an organic semiconductor material is dissolved or dispersed in a first solvent onto a base material in a predetermined pattern; applying a second solvent in which solubility of the organic semiconductor material is lower than that in the first solvent into a region of the base material having the liquid composition applied thereto; and removing the second solvent.

In this case, it is possible to provide a manufacturing method of an organic semiconductor film which is able to manufacture an organic semiconductor film stably having excellent properties such as carrier mobility over a long period of time.

In the manufacturing method of an organic semiconductor film according to the aspect of the invention, it is preferable that the organic semiconductor material is a polymer.

In this case, it is possible to reduce a variation in properties between the organic semiconductor films to be manufactured and between portions.

In the manufacturing method of an organic semiconductor film according to the aspect of the invention, it is preferable that removing the first solvent is included between the applying the liquid composition and the applying the second solvent.

In this case, it is possible to preferably prevent involuntary wet spreading of a liquid on the base material, and it is possible to reliably manufacture the organic semiconductor film into a desired shape. In addition, in the organic semiconductor film to be manufactured, it is possible to more reliably set an alignment of molecules of the organic semiconductor material into a more preferred state, and it is possible to make properties such as carrier mobility particularly excellent. In addition, by removing the first solvent prior to the applying the second solvent, it is possible to more reliably prevent the first solvent from remaining in the organic semiconductor film to be finally obtained.

In the manufacturing method of an organic semiconductor film according to the aspect of the invention, it is preferable that the applying the second solvent is performed by attaching liquid droplets of the second solvent onto the base material having the liquid composition applied thereto.

In this case, it is possible to form a semiconductor film only in a position necessary for design by suppressing broadening of a semiconductor which is dissolved again.

In the manufacturing method of an organic semiconductor film according to the aspect of the invention, it is preferable that the applying the second solvent is performed by exposing the base material having the liquid composition applied thereto into an atmosphere including the second solvent in a vaporized state.

In this case, it is possible to form the semiconductor film only in a position necessary for design by suppressing broadening of the semiconductor which is dissolved again.

In the manufacturing method of an organic semiconductor film according to the aspect of the invention, it is preferable that a second virial coefficient of the first solvent with respect to the organic semiconductor material at 25° C. is a positive value, and a second virial coefficient of the second solvent with respect to the organic semiconductor material at 25° C. is a negative value.

In this case, it is possible to make preservation stability of the liquid composition including the organic semiconductor material particularly excellent and to more stably manufacture the organic semiconductor film over a long period of time, and in the organic semiconductor film to be manufactured, it is possible to more reliably set the alignment of the molecules of the organic semiconductor material into a more preferred state and to make properties such as carrier mobility particularly excellent.

In the manufacturing method of an organic semiconductor film according to the aspect of the invention, it is preferable that an applied amount of the second solvent with respect to 1 g of the organic semiconductor material is greater than or equal to 10 g and less than or equal to 10000 g.

In this case, in the organic semiconductor film to be manufactured, it is possible to more reliably set the alignment of the molecules of the organic semiconductor material into a more preferred state and to make properties such as carrier mobility particularly excellent. In addition, it is possible to make productivity of the organic semiconductor film particularly excellent.

In the manufacturing method of an organic semiconductor film according to the aspect of the invention, it is preferable that the organic semiconductor material is one or more selected from a group consisting of materials having a thiophene ring such as polythiophene, polyhexyl thiophene, and a fluorene-bithiophene copolymer, poly(p-phenylene vinylene), polythienylene vinylene, polyarylamine, a pyrene formaldehyde resin, an ethyl carbazole formaldehyde resin, a fluorene-arylamine copolymer, and derivatives thereof.

In this case, it is possible to make stability of the liquid composition including the first solvent particularly excellent, and the organic semiconductor film to be manufactured is able to make properties such as carrier mobility particularly excellent. In addition, it is possible to reduce a variation in properties between the organic semiconductor films to be manufactured and between the respective portions, and it is possible to make stability of the properties particularly excellent.

In the manufacturing method of an organic semiconductor film according to the aspect of the invention, it is preferable that the first solvent is one or more selected from a group consisting of decalin, mesitylene, trimethylbenzene, cyclohexane, toluene, hexadecane, xylene (3.6), dodecane, tetralin, decane, octane, heptane, trichloroethane, tetrahydronaphthalene, chlorobenzene, and chloroform.

In this case, it is possible to make stability (preservation stability) of the liquid composition including the organic semiconductor material particularly excellent, and it is possible to more stably manufacture the organic semiconductor film having excellent properties such as carrier mobility over a long period of time. In addition, the solvent has suitable volatility, and thus it is advantageous to further improve productivity of the organic semiconductor film. In addition, it is possible to more reliably prevent an adverse effect due to the first solvent remaining in the organic semiconductor film to be manufactured from occurring.

In the manufacturing method of an organic semiconductor film according to the aspect of the invention, it is preferable that the second solvent is one or more selected from a group consisting of cyclohexanone, 1,4-dioxane, methyl naphthalene, dichlorobenzene, dichloromethane, tetrahydrofuran (THF), butane, anisole, and butyl acetate.

In this case, in the organic semiconductor film to be manufactured, it is possible to more reliably set the alignment of the molecules of the organic semiconductor material into a preferred state, and it is possible to make properties such as carrier mobility particularly excellent. In addition, the solvent has suitable volatility, and thus it is advantageous to further improve productivity of the organic semiconductor film.

According to another aspect of the invention, there is provided an organic semiconductor film which is manufactured by using the method according to the aspect of the invention.

In this case, it is possible to provide the organic semiconductor film having excellent properties such as carrier mobility.

According to still another aspect of the invention, there is provided a thin film transistor including the organic semiconductor film according to the aspect of the invention.

In this case, it is possible to provide the thin film transistor having high reliability which includes the organic semiconductor film having excellent properties such as carrier mobility.

According to still another aspect of the invention, there is provided an active matrix device including the organic semiconductor film according to the aspect of the invention.

In this case, it is possible to provide the active matrix device having high reliability which includes the organic semiconductor film having excellent properties such as carrier mobility.

According to still another aspect of the invention, there is provided an electro-optical device including the organic semiconductor film according to the aspect of the invention.

In this case, it is possible to provide the electro-optical device having high reliability which includes the organic semiconductor film having excellent properties such as carrier mobility.

According to still another aspect of the invention, there is provided an electronic device including the organic semiconductor film according to the aspect of the invention.

In this case, it is possible to provide the electronic device having high reliability which includes the organic semiconductor film having excellent properties such as carrier mobility.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
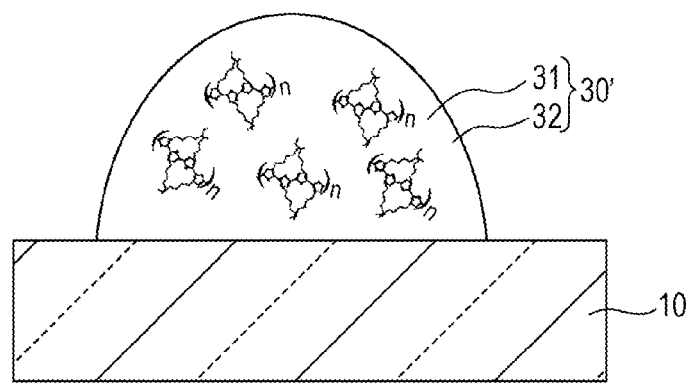
FIGS. 1A to 1D are vertical cross-sectional views schematically illustrating a preferred embodiment of a manufacturing method of an organic semiconductor film of the invention.
Figure 1B:
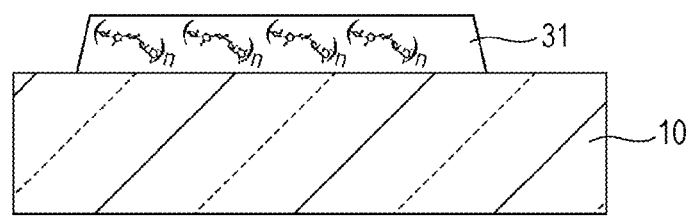

Hereinafter, preferred embodiments of the invention will be described in detail with reference to the drawings.
Manufacturing Method of Organic Semiconductor Film First, a manufacturing method of an organic semiconductor film of the invention will be described.

FIGS. 1A to 1D are vertical cross-sectional views schematically illustrating a preferred embodiment of the manufacturing method of an organic semiconductor film of the invention.

As illustrated in FIGS. 1A to 1D, the manufacturing method of a organic semiconductor film according to this embodiment includes a liquid composition applying step (1a) applying a liquid composition (a composition for a organic semiconductor film) 30' in which an organic semiconductor material 31 is dissolved or dispersed in a first solvent 32 onto a base material 10 in a predetermined pattern, a first solvent removing step (1b) removing the first solvent 32 included in the liquid composition 30', a second solvent applying step (1c) applying a second solvent 33 in which solubility of the organic semiconductor material 31 is lower than that in the first solvent 32 onto a region of the base material 10 having the liquid composition 30' applied thereto, and a second solvent removing step (1d) removing the second solvent 33.

Liquid Composition Applying Step

In this step, the liquid composition (composition for an organic semiconductor film) 30' is applied onto the base material 10 (1a).

In the first solvent 32, solubility of the organic semiconductor material 31 is high compared to that in the second solvent 33 described later in detail. For this reason, in the liquid composition 30', the organic semiconductor material 31 is in a completely dissolved state (for example, a state where a side chain is sufficiently broadened when the organic semiconductor material 31 is a polymer) (refer to FIG. 1A), and thus becomes stable in a solvent. Therefore, occurrence of precipitation or aggregation of a solid content is effectively prevented at the time of preservation of the liquid composition 30' or the like. Thus, by including the first solvent 32, it is possible to make preservation stability of the liquid composition 30' excellent, and thus it is possible to stably manufacture an organic semiconductor film 30 using the liquid composition 30' over a long period of time, and as a result thereof, it is possible to obtain an effect such as an improvement in productivity and a yield ratio of the organic semiconductor film 30 and a reduction in the production cost of the organic semiconductor film 30.

As a method of applying the liquid composition (the composition for an organic semiconductor film) 30' onto the base material 10, for example, a coating method such as a spin coating method, a casting method, a microgravure coating method, a gravure coating method, a bar coating method, a roll coating method, a wire bar coating method, a dip coating method, and a spray coating method, a printing method such as a screen printing method, a flexographic printing method, an offset printing method, an ink jet method, and a micro contact printing method, and the like are included, and one of them or a combination of two or more thereof is able to be used. Among them, from a point of accurately and efficiently forming a fine pattern, an ink jet method is preferable. In addition, in the related art, when a solution (a liquid composition) including an organic semiconductor material is applied by using an ink jet method, nozzle clogging or the like occurs due to precipitation or aggregation of a solid content which occurs at the time of preservation of the solution, and accuracy of an ejection amount or an applying position (an impact position) decreases, and thus an involuntary variation in properties or the like easily occurs in an organic semiconductor film to be manufactured, but according to the invention, even when an ink jet method is used, it is possible to reliably prevent such a problem. That is, when the liquid composition is applied by the ink jet method, the effect of the invention is more remarkably expressed.

Hereinafter, a constituent of the liquid composition (the composition for an organic semiconductor film) 30' will be described.

As described above, in the liquid composition 30', the organic semiconductor material 31 is dissolved or dispersed in the first solvent 32.

The organic semiconductor material 31 may be a low molecular material, and it is preferable that the organic semiconductor material 31 is a polymer. Accordingly, it is possible to more effectively prevent a variation in properties between the organic semiconductor films 30 to be manufactured and between portions from occurring, and it is possible to make stability of properties particularly excellent. In addition, when the organic semiconductor material is a polymer, in the related art, the precipitation or the aggregation of the solid content occurs at the time of the preservation of the composition for an organic semiconductor film or the like, and thus an involuntary variation in properties particularly easily occurs in the organic semiconductor film to be manufactured, but according to the invention, even when the organic semiconductor material is a polymer, it is possible to effectively prevent such a problem from occurring. That is, when the organic semiconductor material is a polymer, the effect of the invention is more remarkably expressed.

When the organic semiconductor material 31 is a polymer, a weight-average molecular weight thereof is preferably greater than or equal to 100 and less than or equal to 10000000, and is more preferably greater than or equal to 1000 and less than or equal to 1000000. Accordingly, it is possible to more effectively prevent a variation in properties between the organic semiconductor films 30 to be manufactured and between the respective portions and to make stability of properties more excellent, and it is possible to make preservation stability or the like of the liquid composition 30' particularly excellent and to more stably manufacture the organic semiconductor film over a long period of time. Furthermore, the weight-average molecular weight of the organic semiconductor material 31 is able to be obtained by being measured using a Prominence gel permeation chromatography (GPC) system (manufactured by Shimadzu Corporation). The weight-average molecular weight of the organic semiconductor material 31 in examples described later is a value obtained by being measured using such a device.

As a specific example of the organic semiconductor material 31, for example, polythiophene, polyhexyl thiophene, poly(p-phenylene vinylene), polythienylene vinylene, polyarylamine, a pyrene formaldehyde resin, an ethyl carbazole formaldehyde resin, a fluorene-bithiophene copolymer, a fluorene-arylamine copolymer, derivatives thereof, and the like are included, and one of them or a combination of two or more thereof may be used. By using such a material, the organic semiconductor film 30 to be manufactured has particularly excellent properties such as carrier mobility. In addition, it is possible to more effectively prevent a variation in properties between the organic semiconductor films 30 to be manufactured and between the respective portions, and it is possible to make stability of properties particularly excellent. In addition, in the organic semiconductor material having a thiophene ring, temporal stability at the time of being dissolved in the organic solvent is particularly low, and thus the precipitation or the aggregation of the solid content particularly easily occurs, but according to the invention, it is possible to more reliably prevent such a problem from occurring. That is, when the organic semiconductor material 31 has a thiophene ring in the molecules, the effect of the invention is more remarkably expressed.

A content rate of the organic semiconductor material 31 in the liquid composition 30' is preferably greater than or equal to 0.1 mass % and less than or equal to 5 mass %, and is more preferably greater than or equal to 0.5 mass % and less than or equal to 2 mass %. Accordingly, it is possible to make preservation stability of the liquid composition 30' particularly excellent and to reliably prevent involuntary precipitation of the organic semiconductor material 31 at the time of the preservation or the like, and it is possible to easily form the organic semiconductor layer having a sufficient film thickness. In addition, in a manufacturing process of the organic semiconductor film 30, it is possible to smoothly remove the first solvent 32, and thus it is possible to make manufacturing efficiency of the organic semiconductor film 30 particularly excellent.

In the first solvent 32, solubility of the organic semiconductor material 31 is higher than that in the second solvent 33 described later in detail.

The solubility of the organic semiconductor material 31 with respect to the first solvent 32 (similarly, the solubility of the organic semiconductor material 31 with respect to the second solvent 33), for example, is able to be defined as a degree of solubility (an amount of organic semiconductor material which is dissolvable with respect to 100 g of a solvent), and for example, when the organic semiconductor material is a high molecular material (a polymer) or the like, it may be difficult to determine whether the organic semiconductor material is in a dissolved state or in a dispersed state. In such as case or the like, the solubility of the organic semiconductor material is able to be evaluated by using a second virial coefficient as an index indicating an interaction degree of the organic semiconductor material which is a solute in the solvent. Specifically, the solubility of the organic semiconductor material increases as the second virial coefficient with respect to the organic semiconductor material becomes greater.

In the invention, it is preferable that a second virial coefficient of the first solvent 32 with respect to the organic semiconductor material 31 at 25° C. is a positive value, and the second virial coefficient of the second solvent 33 with respect to the organic semiconductor material 31 at 25° C. is a negative value. By satisfying such a condition, it is possible to make preservation stability of the liquid composition or the like particularly excellent and to more stably manufacture the organic semiconductor film over a long period of time, and the organic semiconductor film to be manufactured has particularly excellent properties such as carrier mobility.

Furthermore, here, the reason that the temperature is defined as 25° C. is because it is confirmed that, by satisfying the relationship at 25° C. as described above, the effect described above is able to be obtained over a sufficiently wide temperature range including a preservation temperature of the liquid composition to be assumed (for example, a temperature in which the liquid composition is not frozen, and a temperature in which an evaporation rate of the first solvent extremely increases, or denaturation or decomposition of the organic semiconductor material is not substantially problematic), or a treatment temperature of the manufacturing process of an organic semiconductor film to be assumed (a temperature in which it is possible to prevent a defect in the organic semiconductor film to be formed by rapid evaporation of the solvent from occurring) from various tests. Therefore, it is not indicated that a real temperature at the time of manufacturing a semiconductor film is necessarily suppressed to be 25° C.

The second virial coefficient of the first solvent 32 with respect to the organic semiconductor material 31 at 25° C. is preferably greater than or equal to 0 $cm^3 \cdot mol/g^2$ and less than or equal to $30 \times 10^{-4}$ $cm^3 \cdot mol/g^2$, and is more preferably greater than or equal to $0.1 \times 10^{-4}$ $cm^3 \cdot mol/g^2$ and less than or equal to $20 \times 10^{-4}$ $cm^3 \cdot mol/g^2$. Accordingly, the effect described above is more remarkably expressed.

As the first solvent 32, for example, decalin, mesitylene, trimethylbenzene, cyclohexane, toluene, hexadecane, xylene (3.6), dodecane, tetralin, decane, octane, heptane, trichloroethane, tetrahydronaphthalene, chlorobenzene, chloroform, and the like are included, and one of them or a combination of two or more thereof may be used. By using such a solvent, it is possible to make preservation stability of the liquid composition 30' particularly excellent, and it is possible to more stably manufacture the organic semiconductor film 30 having excellent properties such as carrier mobility over a long period of time. In addition, in a manufacturing process of the organic semiconductor film 30, it is possible to easily and reliably evaporate the first solvent 32, and thus it is possible to make productivity of the organic semiconductor film 30 excellent, and it is possible to more reliably prevent an adverse effect due to the first solvent 32 remaining in the organic semiconductor film 30 from occurring.

A content rate of the first solvent 32 in the liquid composition 30' is preferably greater than or equal to 95 mass % and less than or equal to 99.9 mass %, and is more preferably greater than or equal to 98 mass % and less than or equal to 99.5 mass %. Accordingly, it is possible to make preservation stability of the liquid composition 30' particularly excellent and to reliably prevent the involuntary precipitation of the organic semiconductor material 31 at the time of the preservation or the like, and it is possible to easily form the organic semiconductor layer having a sufficient film thickness. In addition, in the manufacturing process of the organic semiconductor film 30, it is possible to smoothly remove the first solvent 32, and it is possible to make manufacturing efficiency of the organic semiconductor film 30 particularly excellent.

The liquid composition 30' may include other components in addition to the components described above. As such a component, for example, an infrared ray energy line absorption agent, a carbon material such as Carbon Black, a near-infrared ray absorption agent having no crystallite of an oxide including at least Cu and/or P (for example, an inorganic material such as ITO ($In_2O_3$ $TiO_2$-based), ATO (ZnO $TiO_2$-based), and lanthanum boride), an organic metal complex such as a phthalocyanine-based complex, an azo-based complex, and a thioamide-based complex, an organic-based infrared ray absorption agent such as a diiminium-based agent, an anthraquinone-based agent, a polymethine-based agent, an azulenium-based agent, a squarylium-based agent, and a thiopyrylium-based agent, and the like as described later are included.

First Solvent Removing Step

Next, the first solvent 32 is removed from the liquid composition 30' applied onto the base material 10 (1b). Thus, in this embodiment, a first solvent removing step in which the first solvent 32 is removed is further included between the liquid composition applying step (1a) and the second solvent applying step (1c). Accordingly, shape stability of a pattern configured of the organic semiconductor material 31 is improved, and for example, in the second solvent applying step described later, it is possible to more reliably prevent the pattern of the liquid composition 30' applied in the liquid composition applying step from being involuntarily disordered at the time of applying the second solvent 33 or the like. As a result thereof, it is possible to more reliably form organic semiconductor film 30 having a desired shape. In addition, the first solvent 32 is removed prior to the second solvent applying step, and thus it is possible to more reliably prevent the first solvent 32 from remaining in the organic semiconductor film 30 to be finally obtained. As described above, it is possible to make reliability of the organic semiconductor film 30 to be finally obtained particularly excellent.

In this step, as a method of removing the first solvent 32, for example, a method of heating the liquid composition 30' applied onto the base material 10, a method of irradiating the liquid composition 30' on the base material 10 with an energy line (for example, infrared ray or the like), a method of placing the base material 10 having the liquid composition 30' applied thereto under a reduced pressure environment, a method of placing the base material 10 having the liquid composition 30' applied thereto under an environment not under an environment of a saturated vapor pressure of the first solvent 32, a method of blowing out gas (gas which does not include the first solvent 32 at a saturated vapor pressure) such as air into the base material 10 having the liquid composition 30' applied thereto, and the like are included, and a combination of two or more methods selected therefrom may be used.

When this step is performed by a method of heating the base material 10 having the liquid composition 30' applied thereto, a heating temperature depends on a constituent of the first solvent 32 or the like, and is preferably greater than or equal to 30° C. and less than or equal to 250° C., and is more preferably greater than or equal to 50° C. and less than or equal to 150° C. Accordingly, it is possible to more reliably prevent involuntary denaturation or decomposition of the organic semiconductor material 31, or the like, or rapid evaporation (bumping or the like) of the first solvent 32, it is possible to more reliably form the organic semiconductor film 30 to be finally obtained to have a desired shape and excellent reliability, and it is possible to make productivity of the organic semiconductor film 30 particularly excellent.

In addition, when this step is performed by energy line irradiation, as the energy line, for example, infrared ray, near-infrared ray, visible light, ultraviolet ray, and the like are able to be used, and infrared ray is preferable. Accordingly, it is possible to make productivity of the organic semiconductor film 30 particularly excellent while more reliably preventing involuntary degradation or transmutation of the organic semiconductor material 31, or the like. In addition, it is possible to effectively prevent a device used for manufacturing the organic semiconductor film 30 from being enlarged, or the like.

In this step, when the energy line is emitted, an energy line absorption agent may be included in the liquid composition 30' or in a portion of the base material 10 having the liquid composition 30' applied thereto. Accordingly, it is possible to more efficiently absorb the energy line and to more preferably promote volatilization of the first solvent 32, and it is possible to make productivity of the organic semiconductor film 30 particularly excellent.

The energy line absorption agent depends on a type of energy line to be emitted, and as the energy line absorption agent (an infrared ray absorption agent) when the energy line is infrared ray, for example, a carbon material such as Carbon Black, a near-infrared ray absorption agent having no crystallite of an oxide including at least Cu and/or P (for example, an inorganic material such as ITO ($In_2O_3$ $TiO_2$-based), ATO (ZnO $TiO_2$-based), and lanthanum boride), an organic metal complex such as a phthalocyanine-based complex, an azo-based complex, and a thioamide-based complex, an organic-based infrared ray absorption agent such as a diiminium-based agent, an anthraquinone-based agent, a polymethine-based agent, an azulenium-based agent, a squarylium-based agent, and a thiopyrylium-based agent, and the like as described later are included.

In addition, as the ultraviolet ray absorption agent (an energy line absorption agent absorbing ultraviolet ray), for example, an inorganic material such as zinc oxide, titanium oxide, cerium oxide, zirconium oxide, mica, kaolin, and sericite, a salicylic acid-based ultraviolet ray absorption agent such as phenyl salicylate, p-tert-butyl phenyl salicylate, and p-octyl phenyl salicylate, a benzophenone-based ultraviolet ray absorption agent such as 2,4-dihydroxy benzophenone, 2-hydroxy benzophenone, 2-hydroxy-4-octoxy benzophenone, 2-hydroxy-4-dodecyloxy benzophenone, 2,2'-dihydroxy-4-methoxy benzophenone, 2,2'-dihydroxy-4, 4'-dimethoxy benzophenone, and 2-hydroxy-4-methoxy-5-sulfobenzophenone, a benzotriazole-based ultraviolet ray absorption agent such as 2-(2'-hydroxy-5'-methyl phenyl) benzotriazole, 2-(2'-hydroxy-5'-tert-butyl phenyl)benzotriazole, 2-(2'-hydroxy-3'-tert-butyl-5'-methyl phenyl)benzotriazole, and 2-(2'-hydroxy-3',5'-di-tert-amyl phenyl) benzotriazole, a cyanoacrylate-based ultraviolet ray absorption agent such as 2-ethylhexyl-2-cyano-3,3'-diphenyl acrylate and ethyl-2-cyano-3,3-diphenyl acrylate, and the like are included.

As an available infrared ray absorption agent, for example, NIR-IM1•NIR-AM1 (manufactured by Nagase ChemteX Corporation), KP Deeper NR Paste (manufactured by Nippon Kayaku Co., Ltd.), EX Color (manufactured by Nippon Shokubai Co., Ltd.), and the like are included.

Furthermore, in this step, the entirety of the first solvent 32 may not be removed insofar as at least a part of the first solvent 32 (preferably, greater than or equal to 90% of the first solvent 32 applied to ten base materials 10) is removed. Even in such a case, it is possible to sufficient remove the first solvent 32 in a subsequent step.

Second Solvent Applying Step

After that, the second solvent 33 is applied onto the region of the base material 10 having the liquid composition 30' applied thereto (1c).

Figure 1C:
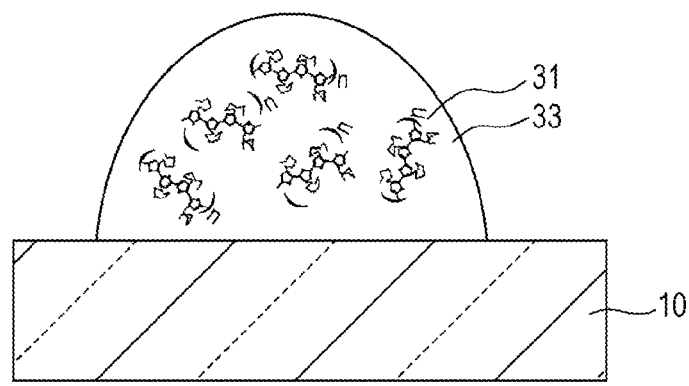
Figure 1D:
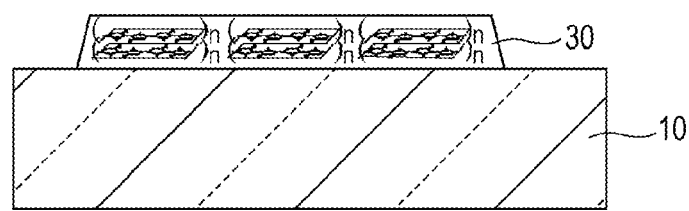

In the second solvent 33, solubility of the organic semiconductor material 31 is lower than that in the first solvent 32, and thus in this step, by applying the second solvent 33, the organic semiconductor material 31 is in a state where flatness of a main chain increases as the side chain contracts, and the molecules are easily stacked on each other (refer to FIG. 1C). For this reason, when the solvent (the second solvent 33) is removed in the subsequent second solvent removing step, it is possible to obtain a film (the organic semiconductor film 30) in a state where aligning properties of the molecules of the organic semiconductor material 31 increase (for example, a state where a molecular chain contracts when the organic semiconductor material 31 is a polymer, and a state where a crystal particle diameter increases when the organic semiconductor material 31 is a material which is able to be in a crystalline state), and it is possible to obtain the organic semiconductor film 30 having excellent properties such as carrier mobility.

Thus, in the invention, the liquid composition in which the organic semiconductor material is dissolved or dispersed in the first solvent (a solvent in which solubility of the organic semiconductor material is higher than that in the second solvent) is used, and the liquid composition is applied onto the base material, then the second solvent (a solvent in which solubility of the organic semiconductor material is lower than that in the first solvent) is applied onto the corresponding region, and thus it is possible to make properties of the organic semiconductor film to be manufactured excellent while making preservation stability of the liquid composition excellent. That is, according to the invention, it is possible to more stably manufacture the organic semiconductor film having excellent properties such as carrier mobility over a long period of time.

Furthermore, when the first solvent and the second solvent are not used together, the excellent effect described above is not obtained.

For example, when the first solvent is not used, the precipitation or the aggregation of the solid content occurs at the time of the preservation of the liquid composition, at the time of forming the semiconductor film, or the like, and thus an involuntary variation in properties or the like occurs in the organic semiconductor film to be manufactured. Such a problem is particularly remarkable when the liquid composition is preserved for a long period of time or the liquid composition is preserved in a severe state (for example, a condition).

When only the liquid composition including the organic semiconductor material and the first solvent is used and the second solvent is not used, it is not possible to obtain a film (the organic semiconductor film) in a state where aligning properties of the molecules of the organic semiconductor material increase (for example, a state where a side chain contracts when the organic semiconductor material is a polymer, and a state where a crystal particle diameter increases when the organic semiconductor material is a material which is able to be in a crystalline state due to an increase in flatness of the main chain), and thus properties (carrier mobility or the like) of the organic semiconductor film to be obtained are degraded.

The second virial coefficient of the second solvent 33 with respect to the organic semiconductor material 31 at 25° C. is preferably greater than or equal to $-5 \times 10^{-4}$ cm$^3$·mol/g$^2$ and less than or equal to 0 cm$^3$·mol/g$^2$, and is more preferably greater than or equal to $-4 \times 10^{-4}$ cm$^2$·mol/g$^2$ and less than or equal to $-0.1 \times 10^{-4}$ cm$^3$·mol/g$^2$. Accordingly, the effect as described above is more remarkably expressed.

As the second solvent 33, for example, cyclohexanone, 1,4-dioxane, methyl naphthalene, dichlorobenzene, dichloromethane, tetrahydrofuran (THF), butane, anisole, butyl acetate, and the like are included, and one of them or a combination of two or more thereof may be used. By using such a solvent, in the organic semiconductor film to be manufactured, it is possible to more reliably set the alignment of the molecules of the organic semiconductor material 31 into a more preferred state, and it is possible to make properties such as carrier mobility particularly excellent. In addition, the solvent has suitable volatility, and thus it is advantageous to further improve productivity of the organic semiconductor film.

In this step, the second solvent 33 may be applied onto at least the region of the base material 10 having the liquid composition 30' applied thereto, and for example, the second solvent 33 may be applied onto the entire base material 10, or may be selectively applied onto only a part of the base material 10.

A method of applying the second solvent 33 is not particularly limited, and for example, a method of attaching liquid droplets of the second solvent 33 onto the base material 10 having the liquid composition 30' applied thereto (for example, a method of attaching the liquid droplets of the second solvent 33 by using various printing methods such as an ink jet method, a spray method, or the like, a method of attaching mist of the second solvent 33, or the like), a method of exposing the base material 10 having the liquid composition 30' applied thereto into an atmosphere including the second solvent 33 in a vaporized state, a method of immersing the base material 10 having the liquid composition 30' applied thereto in the second solvent 33, a method of attaching the second solvent 33 onto the base material 10 having the liquid composition 30' applied thereto by using a method such as a brush coating method, and the like are included, and one or a combination of two or more methods selected therefrom may be used.

Among them, it is preferable that this step is performed by attaching the liquid droplets of the second solvent 33 onto the base material 10 having the liquid composition 30' applied thereto. Accordingly, it is possible to form the semiconductor film only in a position necessary for design by suppressing broadening of the semiconductor film at the time of being dissolved again.

In addition, when this step is performed by exposing the base material 10 having the liquid composition 30' applied thereto into the atmosphere including the second solvent 33 in a vaporized state, it is possible to form the semiconductor film only in a position necessary for design by suppressing the broadening of the semiconductor film at the time of being dissolved.

An applied amount of the second solvent 33 with respect to 1 g of the organic semiconductor material 31 on the base material 10 is preferably greater than or equal to 10 g and less than or equal to 10000 g, and is more preferably greater than or equal to 100 g and less than or equal to 1000 g. Accordingly, in the organic semiconductor film 30 to be manufactured, it is possible to more reliably set the alignment of the molecules of the organic semiconductor material 31 into a more preferred state, and it is possible to make properties such as carrier mobility particularly excellent. In addition, it is possible to make productivity of the organic semiconductor film 30 particularly excellent.

Furthermore, in this step, the second solvent 33 may be independently applied, or may be applied together with other components. For example, a mixture including the other component together with the second solvent 33 may be applied onto a region of the base material having the liquid composition applied thereto.

Second Solvent Removing Step

After that, the second solvent 33 on the base material 10 is evaporated (1$d$). Accordingly, the organic semiconductor film 30 in a solid state is obtained. As described above, the organic semiconductor material 31 is in a lower dissolved state (a state where an interaction with the solvent is low), flatness of the main chain increases as the side chain contracts, and the molecules are easily stacked on each other (refer to FIG. 1C), and thus when the solvent (the second solvent 33) is removed in this step, it is possible to obtain the organic semiconductor film 30 in a state where aligning properties of the molecules of the organic semiconductor material 31 increase (for example, a state where flatness of the main chain increases when the organic semiconductor material 31 is a polymer, and a state where a crystal particle diameter increases when the organic semiconductor material 31 is a material which is able to be in a crystalline state). As a result thereof, the organic semiconductor film 30 to be obtained has excellent properties such as carrier mobility.

As a method of evaporating the second solvent 33, a method which is described as the method of evaporating the first solvent 32 is able to be adopted.

When this step is performed by heat applied onto the base material 10, a heating temperature depends on a constituent of the second solvent 33, or the like, and is preferably greater than or equal to 20° C. and less than or equal to 250° C., and is more preferably greater than or equal to 60° C. and less than or equal to 150° C. Accordingly, it is possible to more reliably prevent the involuntary denaturation or decomposition of the organic semiconductor material 31 or the like or the rapid evaporation (the bumping or the like) of the second solvent 33 and to more reliably form the organic semiconductor film 30 to be finally obtained having a desired shape and excellent reliability, and it is possible to make productivity of the organic semiconductor film 30 particularly excellent. In addition, by setting the heating temperature in this step to a value in the range described above, it is possible to set the organic semiconductor film 30 into a state where aligning properties of the molecules of the organic semiconductor material 31 further increase, and thus properties such as carrier mobility become particularly excellent. In addition, by setting the heating temperature in this step to the value in the range described above, it is possible to more reliably prevent the second solvent 33 from remaining in the organic semiconductor film 30 to be finally obtained. In addition, even when the first solvent 32 is not removed in the step described above, it is possible to reliably remove the first solvent 32 in this step, and it is possible to more reliably prevent the first solvent 32 from remaining in the organic semiconductor film 30 to be finally obtained. As described above, it is possible to make reliability of the organic semiconductor film 30 particularly excellent.

Furthermore, the method of evaporating the second solvent 33 may be identical to the method of evaporating the first solvent 32, or may be different from the method of evaporating the first solvent 32.

Organic Semiconductor Film

The organic semiconductor film of the invention is manufactured by using the method of the invention as described above. Accordingly, it is possible to provide the organic semiconductor film having excellent properties such as carrier mobility.

An average thickness of the organic semiconductor film of the invention is not particularly limited, and is preferably greater than or equal to 0.1 nm and less than or equal to 1000 nm, is more preferably greater than or equal to 1 nm and less than or equal to 500 nm, and is further preferably greater than or equal to 2 nm and less than or equal to 100 nm.

Thin Film Transistor

Next, a thin film transistor of the invention will be described.

Figure 2A:
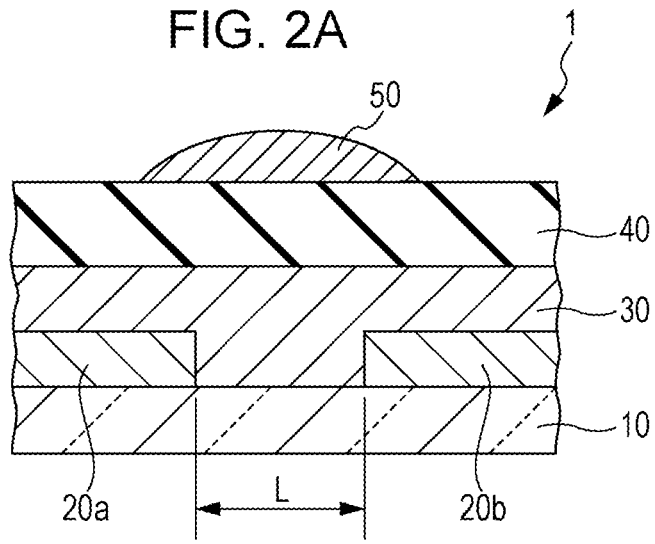
FIGS. 2A and 2B are schematic views illustrating a preferred embodiment of a thin film transistor of the invention.
Figure 2B:
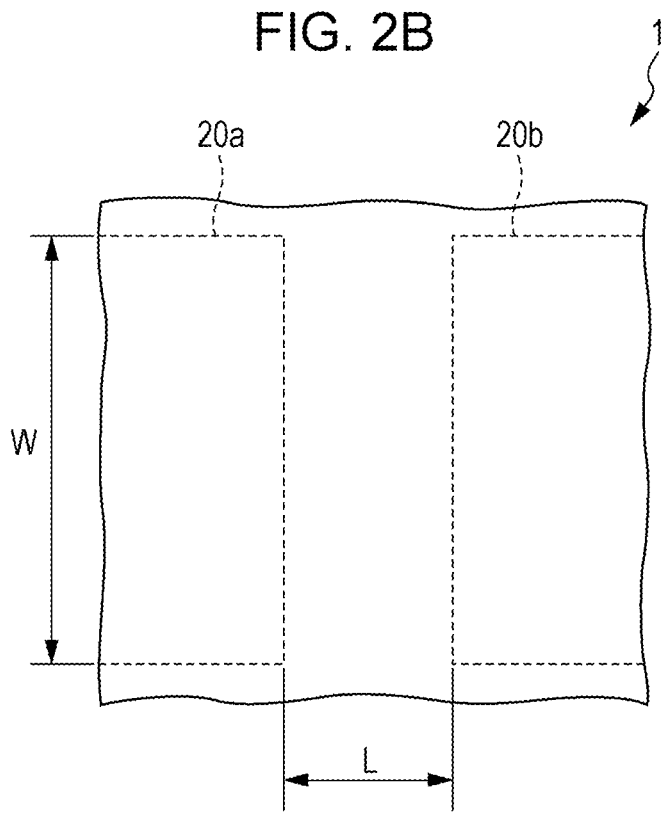

FIGS. 2A and 2B are schematic views illustrating a preferred embodiment of the thin film transistor of the invention (FIG. 2A is a vertical cross-sectional view, and FIG. 2B is a plan view).

Furthermore, in the following description, an upper side indicates "Up", and a lower side indicates "Down" in FIGS. 2A and 2B.

The thin film transistor of the invention includes the organic semiconductor film of the invention described above. Accordingly, it is possible to provide the thin film transistor having high reliability in which the organic semiconductor film having excellent properties such as carrier mobility is included.

A thin film transistor 1 illustrated in FIGS. 2A and 2B is a top gate and bottom contact type thin film transistor in which a source electrode 20a and a drain electrode 20b are positioned on a substrate (the base material) 10 side from a gate electrode 50 through an organic semiconductor layer 30 and a gate insulating layer 40.

Hereinafter, a configuration of each portion will be sequentially described.

The substrate (the base material) 10 supports each layer (each portion) configuring the thin film transistor 1.

As the substrate 10, for example, a glass substrate, a plastic substrate (a resin substrate) configured of polyethyleneterephthalate (PET), polyethylenenaphthalate (PEN), polyether sulfone (PES), aromatic polyester (a liquid crystal polymer), polyimide (PI), or the like, a quartz substrate, a silicon substrate, a metal substrate, a gallium arsenide substrate, and the like are able to be used.

When flexibility is applied to the thin film transistor 1, as the substrate 10, a plastic substrate or a thin metal substrate (having a comparatively thin film thickness) is selected.

An average thickness of the substrate 10 is not particularly limited, and is preferably greater than or equal to 0.5 μm and less than or equal to 500 μm, and is preferably greater than or equal to 10 μm and less than or equal to 300 μm.

The source electrode 20a and the drain electrode 20b (a pair of electrodes) are disposed on the substrate 10. That is, the source electrode 20a and the drain electrode 20b are disposed on the approximately same plane.

A constitutional material of the source electrode 20a and the drain electrode 20b is not particularly limited insofar as the material is a known electrode material. Specifically, as the constitutional material, a metal material such as Cr, Al, Ta, Mo, Nb, Cu, Ag, Au, Pd, In, Ni, Nd, Co, or an alloy thereof, an oxide thereof, and the like are able to be used.

In addition, the source electrode 20a and the drain electrode 20b are able to be configured of a conductive organic material.

In addition, when the organic semiconductor layer 30 is p-type, it is preferable that Au, Ag, Cu, Pt, or an alloy thereof is mainly used as each constitutional material of the source electrode 20a and the drain electrode 20b. This material has a comparatively high work function, and thus it is possible to improve injection efficiency of a hole (a carrier) with respect to the organic semiconductor layer 30 by configuring the source electrode 20a using this material.

Furthermore, each average thickness of the source electrode 20a and the drain electrode 20b is not particularly limited, and is preferably greater than or equal to 10 nm and less than or equal to 2000 nm, and is more preferably greater than or equal to 50 nm and less than or equal to 1000 nm.

A distance between the source electrode 20a and the drain electrode 20b, that is, a channel length L illustrated in FIGS. 2A and 2B is preferably greater than or equal to 2 μm and less than or equal to 30 μm, and is more preferably greater than or equal to 2 μm and less than or equal to 20 μm. By setting a value of the channel length L to be in such a range, it is possible to improve properties (in particular, to increase an ON current value) of the thin film transistor 1.

In addition, a length of the source electrode 20a and the drain electrode 20b, that is, a channel width W illustrated in FIG. 2B is preferably greater than or equal to 0.1 mm and less than or equal to 5 mm, and is more preferably greater than or equal to 0.3 mm and less than or equal to 3 mm. By setting a value of the channel width W to be in such a range, it is possible to reduce parasitic capacitance, and thus it is possible to prevent degradation of properties of the thin film transistor 1. In addition, it is possible to prevent the thin film transistor 1 from being enlarged.

The organic semiconductor layer (the organic semiconductor film) 30 is disposed on the substrate 10 including the source electrode 20a and the drain electrode 20b in contact with the source electrode 20a and the drain electrode 20b to cover the source electrode 20a and the drain electrode 20b. The organic semiconductor layer 30 has a function of applying electricity to the drain electrode 20b from the source electrode 20a according to an electric field applied by the gate electrode 50.

Furthermore, the organic semiconductor layer 30 may not be disposed to cover the source electrode 20a and the drain electrode 20b, or may be disposed in a region (a channel region) between the at least source electrode 20a and the drain electrode 20b.

The gate insulating layer 40 is formed on an upper surface (between the gate electrode 50, and the source electrode 20a and the drain electrode 20b) of the organic semiconductor layer 30.

The gate insulating layer 40 insulates the gate electrode 50 from the source electrode 20a and the drain electrode 20b.

A constitutional material of the gate insulating layer 40 is not particularly limited insofar as the material is a known gate insulating body material, and as the constitutional material, either an organic material or an inorganic material is able to be used.

As the organic material, polymethyl methacrylate, polyvinyl phenol, polyimide, polysulfone, polyvinyl alcohol, polyvinyl acetate, polyvinyl phenol, and the like are included, and one of them or a combination of two or more thereof is able to be used.

On the other hand, as the inorganic material, a metal oxide such as silica, silicon nitride, aluminum oxide, and tantalum oxide, a metal composite oxide such as barium strontium titanate, and lead zirconium titanate, and the like are included, and one of them or a combination of two or more thereof is able to be used.

An average thickness of the gate insulating layer 40 is not particularly limited, and is preferably greater than or equal to 10 nm and less than or equal to 5000 nm, and is more preferably greater than or equal to 100 nm and less than or equal to 2000 nm. By setting the thickness of the gate insulating layer 40 to be in the range described above, it is possible to decrease an operating voltage of the thin film transistor 1 while reliably insulating the gate electrode 50 from the source electrode 20a and the drain electrode 20b.

Furthermore, the gate insulating layer 40 is not limited to a configuration of a single layer, and may have a configuration in which a plurality of layers are laminated.

The gate electrode 50 is disposed in a position of the gate insulating layer 40 corresponding to the region between the source electrode 20a and the drain electrode 20b.

As a constitutional material of the gate electrode 50, the same materials as that described in the source electrode 20a and the drain electrode 20b are able to be used.

An average thickness of the gate electrode 50 is not particularly limited, and is preferably greater than or equal to 0.1 nm and less than or equal to 2000 nm, and is more preferably greater than or equal to 1 nm and less than or equal to 1000 nm.

Furthermore, a receiving layer (not illustrated) may be disposed on the gate electrode 50, which is configured of a polyolefin-based polymer such as polyvinyl phenol, polymethyl methacrylate, polysulfone, and polyvinyl alcohol.

In such a thin film transistor 1, when a gate voltage is applied to the gate electrode 50 in a state where a voltage is applied between the source electrode 20a and the drain electrode 20b, a channel is formed in the vicinity of a boundary surface of the organic semiconductor layer 30 with the gate insulating layer 40, and a current flows between the source electrode 20a and the drain electrode 20b by moving the carrier (the hole) through the channel region.

That is, in an OFF state where a voltage is not applied to the gate electrode 50, even when a voltage is applied between the source electrode 20a and the drain electrode 20b, the carrier rarely exists in the organic semiconductor layer 30, and thus only a trace amount of current flows.

In contrast, in an ON state where a voltage is applied to the gate electrode 50, an electric charge is induced into a portion of the organic semiconductor layer 30 facing the gate insulating layer 40, and thus the channel (a flow path of the carrier) is formed. When a voltage is applied between the source electrode 20a and the drain electrode 20b in this state, a current flows through the channel region.

Such a thin film transistor 1, for example, is able to be manufactured as follows. Hereinafter, a manufacturing method of the thin film transistor 1 will be described.

FIGS. 3A to 3G are diagrams (vertical cross-sectional views) for illustrating the manufacturing method of the thin film transistor illustrated in FIGS. 2A and 2B.

The manufacturing method of the thin film transistor 1 illustrated in FIGS. 3A to 3G includes a step of forming the source electrode 20a and the drain electrode 20b on the substrate 10 (a source electrode and drain electrode forming step) [A1], a step of applying the liquid composition (the composition for an organic semiconductor film) 30' in which the organic semiconductor material 31 is dissolved or dispersed in the solvent onto the substrate 10 in a predetermined pattern such that the liquid composition 30' covers the source electrode 20a and the drain electrode 20b (a liquid composition applying step) [A2], a step of volatilizing the first solvent 32 configuring the liquid composition 30' (a first solvent removing step) [A3], a step of applying the second solvent 33 onto the region of the substrate 10 having the liquid composition 30' applied thereto (a second solvent applying step) [A4], a step of removing the second solvent 33 (a second solvent removing step) [A5], a step of forming the gate insulating layer 40 on a surface side of the organic semiconductor layer 30 opposite to the substrate 10 (a gate insulating layer forming step) [A6], and a step of forming the gate electrode 50 on the gate insulating layer 40 (a gate electrode forming step) [A7].

A1. Source Electrode and Drain Electrode Forming Step

Figure 3A:
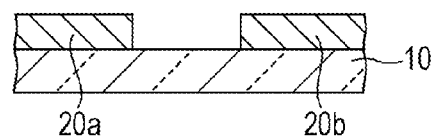
FIGS. 3A to 3G are diagrams (vertical cross-sectional views) for illustrating a manufacturing method of the thin film transistor illustrated in FIG. 2.

First, as illustrated in FIG. 3A, the source electrode 20a and the drain electrode 20b are formed on an upper surface of the substrate 10.

The source electrode 20a and the drain electrode 20b, for example, are able to be formed by using a chemical vapor deposition (CVD) method such as a plasma CVD method, a thermal CVD method, and a laser CVD method, a vacuum deposition method, an electron beam deposition method, a pulsed laser deposition method, a sputtering method (a low temperature sputtering method), a dry plating method such as an ion plating method, a wet plating method such as an electrolytic plating method, an immersion plating method, and an electroless plating method, a spraying method, a sol and gel method, an MOD method, a metal foil joining method, a photolithography method, and the like.

Furthermore, the source electrode 20a and the drain electrode 20b are able to be formed on the substrate 10, for example, by applying (supplying) a conductive material including conductive particles or a conductive organic material to form a film, and then as necessary, by performing a post-treatment (for example, heating, irradiation of infrared ray, application of ultrasonic wave, or the like) with respect to the film.

As the conductive material including the conductive particles, a dispersion liquid in which metal fine particles are dispersed, a polymer mixture including the conductive particles, and the like are included.

In addition, as the conductive material including the conductive organic material, a solution or a dispersion liquid of the conductive organic material is included.

As a method of applying (supplying) the conductive material onto the substrate 10, for example, a coating method such as a spin coating method, a casting method, a microgravure coating method, a gravure coating method, a bar coating method, a roll coating method, a wire bar coating method, a dip coating method, and a spray coating method, a printing method such as a screen printing method, a flexographic printing method, an offset printing method, an ink jet method, and a micro contact printing method, and the like are included, and one of them or a combination of two or more thereof is able to be used.

A2. Liquid Composition Applying Step

Figure 3B:
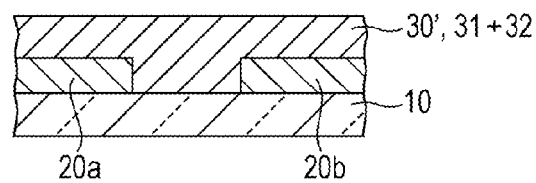
Figure 3C:
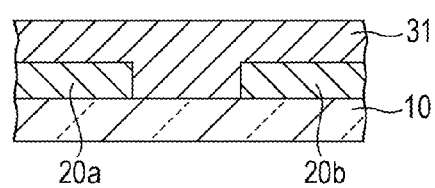
Figure 3D:
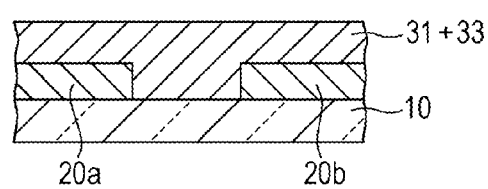
Figure 3E:
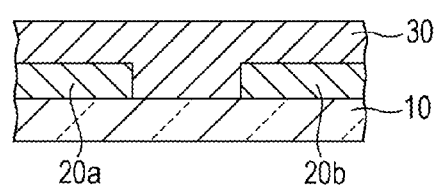

Next, as illustrated in FIG. 3B, the liquid composition 30' is applied onto the upper surface of the substrate 10 to cover the source electrode 20a and the drain electrode 20b.

This step is able to be performed by using the method described in "Manufacturing Method of Organic Semiconductor Film" described above.

Furthermore, an applied region of the liquid composition 30' is not limited to the illustrated configuration, and may be formed only in the region (the channel region) between the source electrode 20a and the drain electrode 20b. Accordingly, when a plurality of thin film transistors 1 are disposed in parallel on the same substrate, it is possible to suppress leak current, and cross talk between elements by independently forming each organic semiconductor layer 30 of the thin film transistors 1. In addition, it is possible to reduce a used amount of the organic semiconductor material 31, and it is possible to reduce the manufacturing cost.

A3. First Solvent Removing Step

Next, the first solvent 32 is volatilized from the liquid composition 30'.

This step is able to be performed by using the method described in "Manufacturing Method of Organic Semiconductor Film" described above.

A4. Second Solvent Applying Step

Next, the second solvent 33 is applied onto the region of the substrate 10 having the liquid composition 30' applied thereto.

This step is able to be performed by using the method described in "Manufacturing Method of Organic Semiconductor Film" described above.

A5. Second Solvent Removing Step

Next, the second solvent 33 is volatilized. Accordingly, the organic semiconductor layer (the organic semiconductor film) 30 is obtained.

This step is able to be performed by using the method described in "Manufacturing Method of Organic Semiconductor Film" described above.

A6. Gate Insulating Layer Forming Step

Figure 3F:
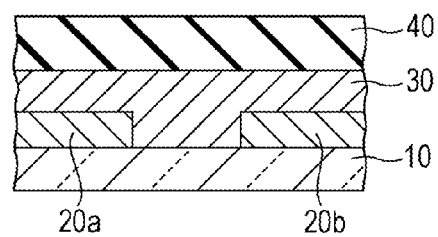

Next, as illustrated in FIG. 3F, the gate insulating layer 40 is formed on the organic semiconductor layer 30.

For example, when the gate insulating layer 40 is configured of an organic high molecular material, the gate insulating layer 40 is able to be formed by applying (supplying) a liquid including the organic high molecular material or a precursor thereof to cover the organic semiconductor layer 30, and then as necessary, by performing a post-treatment (for example, heating, irradiation of infrared ray, application of ultrasonic wave, or the like) with respect to the film.

As a method of applying (supplying) the liquid including the organic high molecular material or the precursor thereof onto the gate electrode 50, for example, a coating method such as a spin coating method or a dip coating method, a printing method such as an ink jet printing method (a liquid droplet ejecting method) or a screen printing method, and the like are able to be used.

In addition, it is possible to form a polymer such as polyparaxylene by reacting the precursor using a CVD method.

In addition, when the gate insulating layer 40 is configured of an inorganic material, the gate insulating layer 40, for example, is able to be formed by using a thermal oxidation method, a CVD method, and an SOG method. In addition, by using polysilazane as a raw material, it is possible to form a silica film and a silicon nitride film as the gate insulating layer 40 by using a wet process.

A7. Gate Electrode Forming Step

Figure 3G:
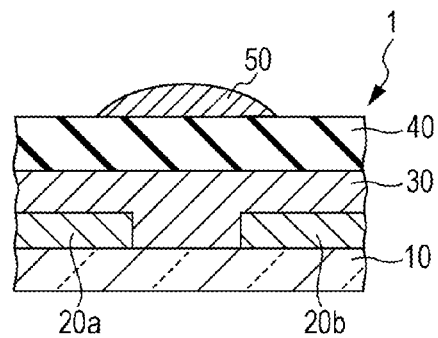

Finally, as illustrated in FIG. 3G, the gate electrode 50 is formed on the gate insulating layer 40.

The gate electrode 50 is able to be formed by the same method as that of the source electrode 20a and the drain electrode 20b in [A1].

Through the steps described above, the thin film transistor 1 illustrated in FIGS. 2A and 2B is obtained.

Active Matrix Device and Electro-Optical Device

Next, an active matrix device and an electro-optical device of the invention will be described.

The active matrix device of the invention includes the organic semiconductor film of the invention described above. Accordingly, it is possible to provide the active matrix device having high reliability in which the organic semiconductor film having excellent properties such as carrier mobility is included.

In addition, the electro-optical device of the invention includes the organic semiconductor film of the invention described above. Accordingly, it is possible to provide the electro-optical device having high reliability in which the organic semiconductor film having excellent properties such as carrier mobility is included.

In the following description, an electrophoretic display device will be described as an example of the electro-optical device of the invention in which the active matrix device including the thin film transistor 1 described above (a device in which the electronic device described above is formed on a substrate) is assembled. Furthermore, the active matrix device is manufactured by forming a plurality of electronic devices described above on the substrate.

Figure 4:
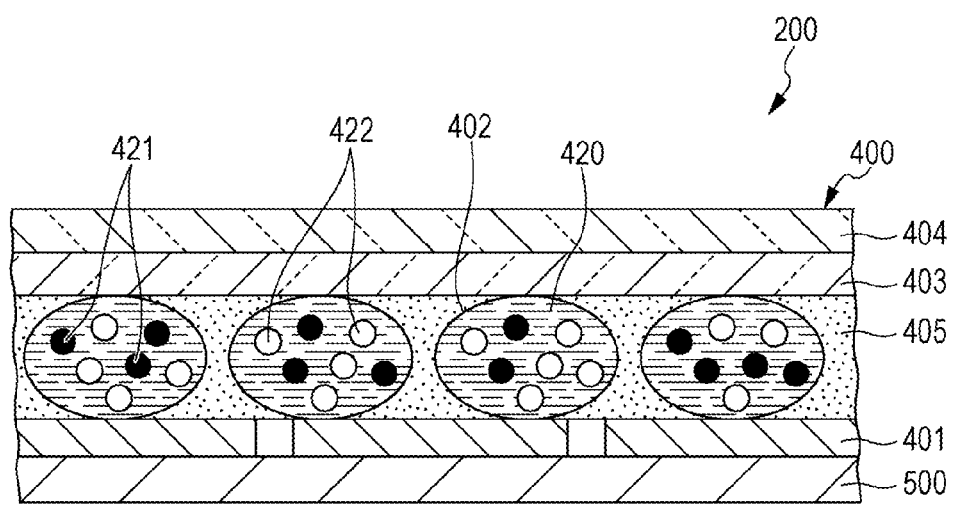
FIG. 4 is a vertical cross-sectional view illustrating an embodiment of an electrophoretic display device.
Figure 5:
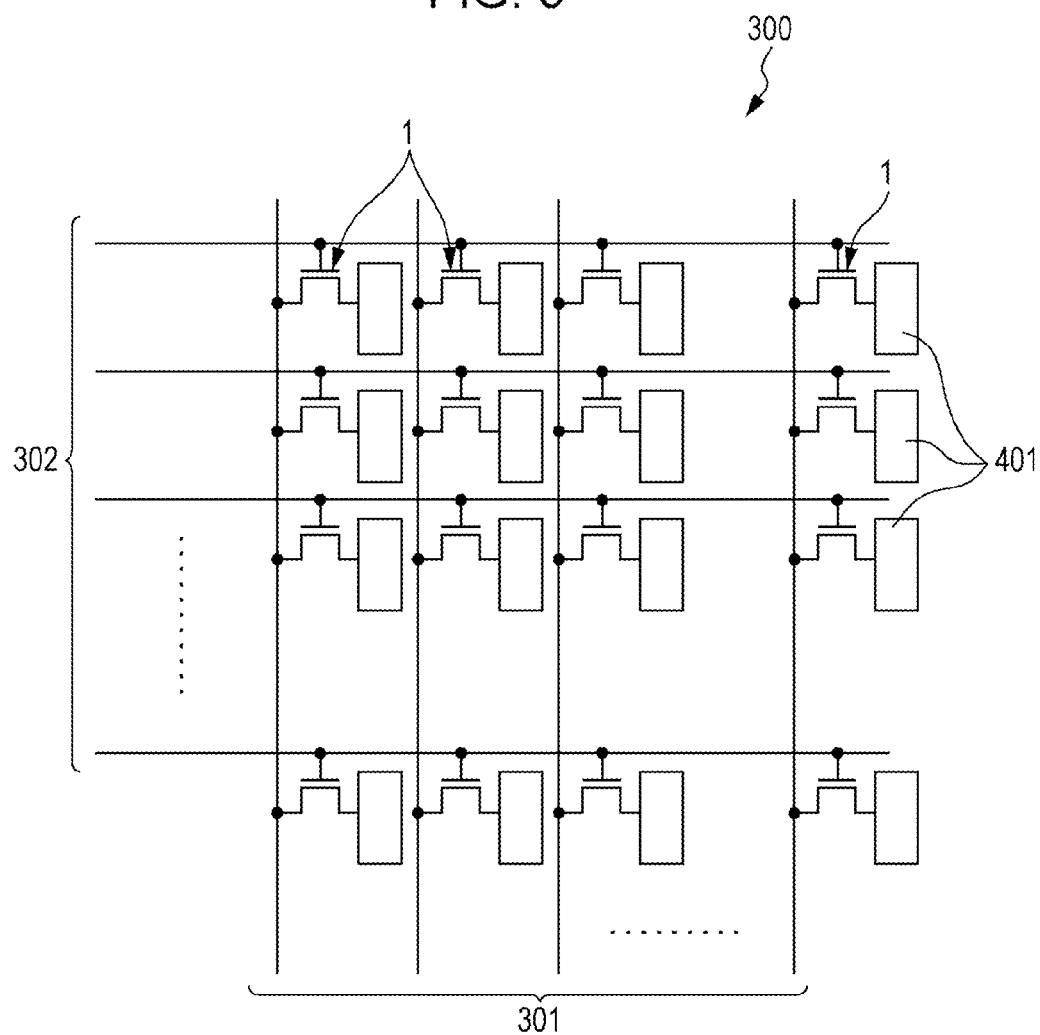
FIG. 5 is a block diagram illustrating a configuration of an active matrix device including the electrophoretic display device illustrated in FIG. 4.

FIG. 4 is a vertical cross-sectional view illustrating an embodiment of the electrophoretic display device, and FIG. 5 is a block diagram illustrating a configuration of the active matrix device including the electrophoretic display device illustrated in FIG. 4.

An electrophoretic display device 200 illustrated in FIG. 4 includes an active matrix device 300 disposed on a substrate 500, and an electrophoretic display unit 400 electrically connected to the active matrix device 300.

As illustrated in FIG. 5, the active matrix device 300 includes a plurality of data lines 301 and a plurality of scanning lines 302 which are orthogonal to each other, and the thin film transistor 1 disposed in the vicinity of each intersection point between the data line 301 and the scanning line 302.

Then, the gate electrode 50 of the thin film transistor 1 is connected to the scanning line 302, the source electrode 20a of the thin film transistor 1 is connected to the data line 301, and the drain electrode 20b of the thin film transistor 1 is connected to a pixel electrode (an individual electrode) 401 described later.

As illustrated in FIG. 4, in the electrophoretic display unit 400, the pixel electrode 401, microcapsules 402, a transparent electrode (a common electrode) 403, and a transparent substrate 404 are laminated on the substrate 500 in this order.

Then, the microcapsules 402 are fixed between the pixel electrode 401 and the transparent electrode 403 by a binder material 405.

The pixel electrode 401 is in the shape of a matrix, that is, is divided such that the pixel electrode 401 is regularly arranged in vertical and horizontal directions.

In each of the microcapsules 402, a electrophoretic dispersion liquid 420 including a plurality of electrophoretic particles having different properties, in this embodiment, two types of electrophoretic particles 421 and 422 having different electric charges and colors (color phases) is sealed.

In such an electrophoretic display device 200, when a selection signal (a selection voltage) is supplied to one or a plurality of scanning lines 302, the thin film transistor 1 connected to the scanning line 302 to which the selection signal (the selection voltage) is supplied is turned ON.

Accordingly, the data line 301 and the pixel electrode 401 which are connected to this thin film transistor 1 are substantially in a conductive state. At this time, when desired data (a voltage) is supplied to the data line 301, the data (the voltage) is supplied to the pixel electrode 401.

Accordingly, an electric field is generated between the pixel electrode 401 and the transparent electrode 403, and a direction or intensity of the electric field depends on properties of the electrophoretic particles 421 and 422 or the like, and the electrophoretic particles 421 and 422 are electrophoresed toward any electrode.

On the other hand, when the supplying of the selection signal (the selection voltage) to the scanning line 302 is stopped from this state, the thin film transistor 1 is turned OFF, and thus the data line 301 and the pixel electrode 401 which are connected to this thin film transistor 1 are in a non-conductive state.

Therefore, the supplying and the stopping of the selection signal to the scanning line 302, or the supplying and the stopping of the data to the data line 301 are performed by being suitably combined, and thus it is possible to display a desired image (information) on a display surface side (the transparent substrate 404 side) of the electrophoretic display device 200.

In particular, in the electrophoretic display device 200 of this embodiment, it is possible to display a multi-gradation image by using the electrophoretic particles 421 and 422 having different colors.

In addition, the electrophoretic display device 200 of this embodiment is able to selectively turn the thin film transistor 1 connected to a specific scanning line 302 ON/OFF by including the active matrix device 300, and thus cross talk rarely occurs, and it is possible to speed up a circuit operation, and as a result thereof, it is possible to obtain an image (information) of a high quality.

In addition, the electrophoretic display device 200 of this embodiment is operated at a low driving voltage, and thus it is possible to reduce electric power.

Furthermore, the electro-optical device in which the active matrix device including the thin film transistor 1 described above is assembled is not limited to the application to this electrophoretic display device 200, and for example, is able to be applied to a liquid crystal device, a display device such as an organic EL device or an inorganic EL device, or a light emitting device.

When a manufacturing method of the electro-optical device, for example, is the manufacturing method of the electrophoretic display device described above, a manufacturing process of pasting the active matrix device to a so-called electrophoretic display sheet in which the microcapsules 402 are fixed to the transparent electrode 403 by the binder material 405 is included. In addition, for example, in a case of a liquid crystal device, although it is not illustrated, a manufacturing process in which the active matrix device is pasted to a facing substrate, and a liquid crystal material is injected between the active matrix device and the facing substrate.

Electronic Device

Next, an electronic device of the invention will be described.

The electronic device of the invention the organic semiconductor film of the invention described above. Accordingly, it is possible to provide the electronic device having high reliability in which the organic semiconductor film having excellent properties such as carrier mobility is included.

In this case, the electrophoretic display device 200 described above is able to be assembled in various electronic devices. Hereinafter, the electronic device of the invention including the electrophoretic display device 200 will be described.

Electronic Paper

First, an embodiment at the time of applying the electronic device of the invention to electronic paper will be described.

Figure 6:
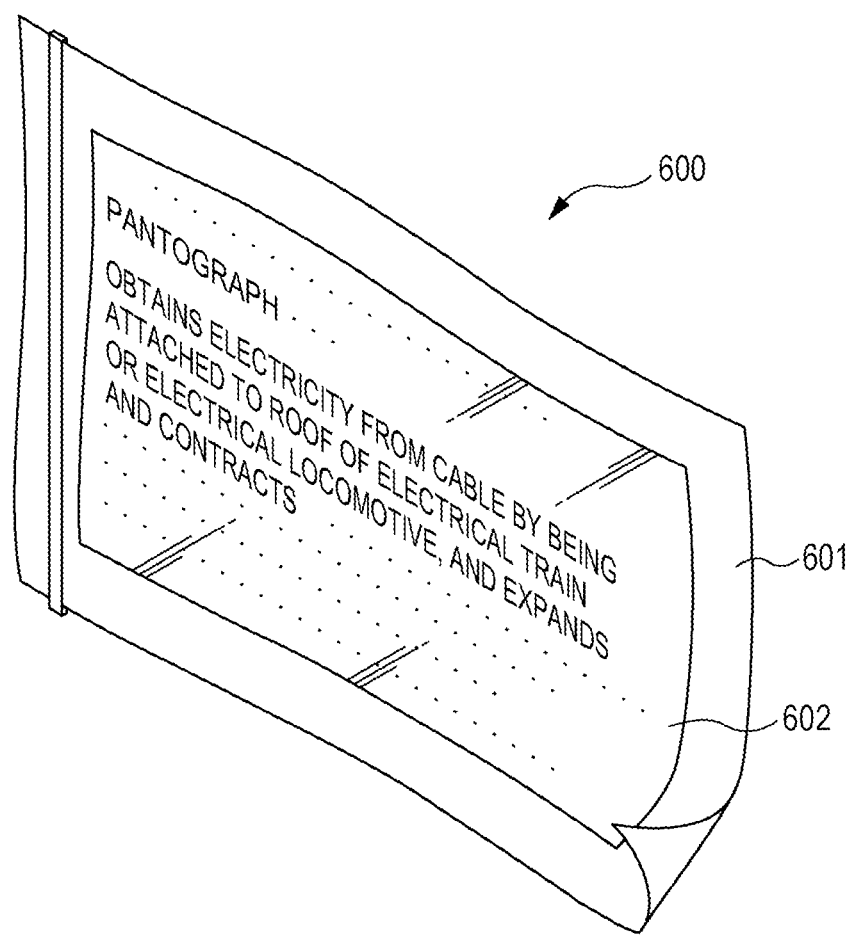
FIG. 6 is a perspective view illustrating an embodiment at the time of applying an electronic device of the invention to electronic paper.

FIG. 6 is a perspective view illustrating an embodiment at the time of applying the electronic device of the invention to the electronic paper.

Electronic paper 600 illustrated in FIG. 6 includes a main body 601 which is configured of a rewritable sheet having the same texture and flexibility as that of paper, and a display unit 602.

In this electronic paper 600, the display unit 602 is configured of the electrophoretic display device 200 described above.

Display

Next, an embodiment at the time of applying the electronic device of the invention to a display will be described.

Figure 7A:
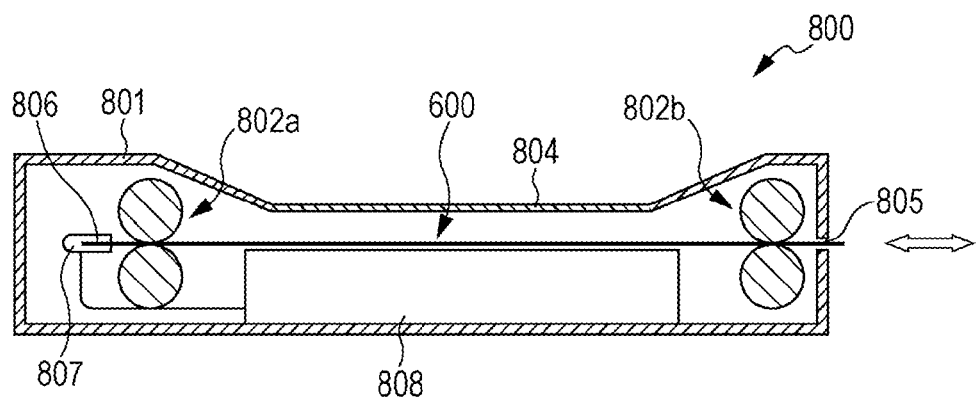
FIGS. 7A and 7B are diagrams illustrating an embodiment at the time of applying an electronic device of the invention to a display.
Figure 7B:
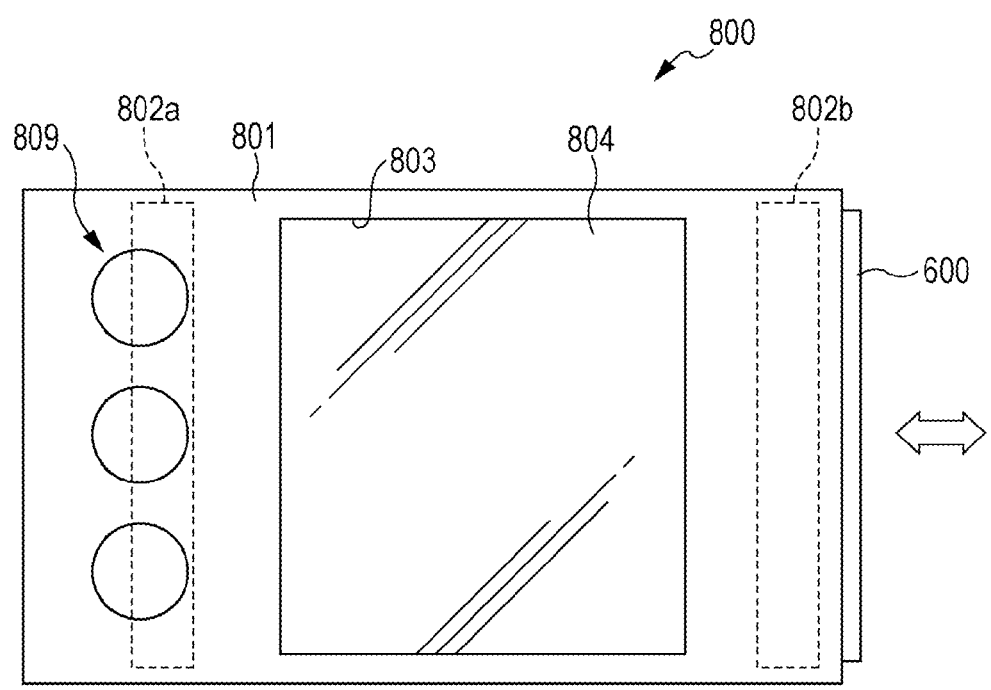

FIGS. 7A and 7B are diagrams illustrating an embodiment at the time of applying the electronic device of the invention to the display, and FIG. 7A is a cross-sectional view, and FIG. 7B is a plan view.

A display 800 illustrated in FIGS. 7A and 7B includes a main body unit 801, and the electronic paper 600 which is disposed on the main body unit 801 to be detachable. Furthermore, the electronic paper 600 has the configuration described above, that is, the same configuration as that illustrated in FIG. 5.

In the main body unit 801, an insertion port 805 to which the electronic paper 600 is able to be inserted is formed on a side portion (in the drawings, on a right side), and two transport roller pairs 802a and 802b are disposed in an inner portion. When the electronic paper 600 is inserted into the main body unit 801 through the insertion port 805, the electronic paper 600 is disposed in the main body unit 801 in a state of being interposed between the transport roller pairs 802a and 802b.

In addition, a rectangular hole portion 803 is formed on a display surface side of the main body unit 801 (in FIG. 7B, on a paper surface side), and a transparent glass plate 804 is inserted to the hole portion 803. Accordingly, it is possible to visually recognize the electronic paper 600 in a state of being disposed in the main body unit 801 from an outer portion of the main body unit 801. That is, in this display 800, a display surface is configured such that the electronic paper 600 in the state of being disposed is visually recognized in the main body unit 801 in the transparent glass plate 804.

In addition, a terminal portion 806 is disposed on a tip end portion (in the drawings, on left side) of the electronic paper 600 in an inserting direction, and a socket 807 to which the terminal portion 806 is connected in a state where the electronic paper 600 is disposed in the main body unit 801 is disposed in the inner portion of the main body unit 801. A controller 808 and a manipulation unit 809 are electrically connected to the socket 807.

In this display 800, the electronic paper 600 is disposed to be detachable from the main body unit 801, and is able to be used by being carried in a state of being detached from the main body unit 801.

In addition, in this display 800, the electronic paper 600 is configured of the electrophoretic display device 200 described above.

Furthermore, the electronic device of the invention is not limited to the applications described above, and for example, is able to be applied to a television, a view finder type video tape recorder or a monitor type video tape recorder, a car navigation device, a pager, an electronic organizer, a calculator, an electronic newspaper, a word processor, a personal computer, a work station, a television telephone, a POS terminal, an equipment with a touch panel, and the like, and the electrophoretic display device 200 is able to be applied to a display unit of these various electronic devices. In addition, electronic device of the invention may include the organic semiconductor film of the invention, but is not limited to a configuration including the electro-optical device.

In the described above, the invention is described on the basis of the preferred embodiments, but the invention is not limited thereto.

For example, the manufacturing method of the organic semiconductor film of the invention may include the liquid composition applying step, the second solvent applying step, and the second solvent removing step, or may further include other steps.

In addition, in the embodiments described above, a case where the first solvent removing step in which the first solvent is removed is further included between the liquid composition applying step and the second solvent removing step is described, but the first solvent removing step may not be included. Even in such a case, the first solvent is able to be removed together with the second solvent in the second solvent removing step. When the first solvent removing step is not included between the liquid composition applying step and the second solvent removing step, it is preferable that the first solvent has higher volatility than the second solvent (a boiling point is low and/or a vapor pressure is high). Accordingly, the effect described above is more remarkably expressed.

In addition, the configuration of each of the portions of the thin film transistor, the active matrix device, the electro-optical device, and the electronic device of the invention is able to be substituted by an arbitrary configuration in which the same function is able to be expressed, or an arbitrary configuration is able to be added.

For example, in the embodiments described above, a top gate and bottom contact type structure is representatively described as the thin film transistor, and the invention may be applied to a thin film transistor having other structures (for example, a bottom gate and bottom contact structure, a bottom gate and top contact structure, a top gate and top contact structure, and the like).

EXAMPLES

Next, specific examples of the invention will be described.

1. Manufacturing of Semiconductor Device
Manufacturing of Semiconductor Device

Example 1

1. Source Electrode and Drain Electrode Forming Step

First, a plastic substrate was prepared, and a degreasing treatment was performed with respect to a surface using ethanol.

Gold was vapor deposited on the plastic substrate, and thus a source electrode and a drain electrode were formed. After forming the source electrode and the drain electrode, the plastic substrate on which the source electrode and the drain electrode were formed was immersed in isopropyl alcohol, and was subjected to ultrasonic cleaning for 5 minutes. After the cleaning, the substrate was dried at 60° C. for 10 minutes.

2. Liquid Composition Applying Step

Next, a liquid composition in which poly(3-hexyl thiophene) (P3HT) (a weight-average molecular weight: 30000) as an organic semiconductor material was dispersed in xylene as a first solvent was applied onto the source electrode, the drain electrode, and the substrate by an ink jet method. An applied amount of the liquid composition was determined such that a designed film thickness of the organic semiconductor film is 20 nm. In the liquid composition, a content rate of xylene as the first solvent was 99 mass %, and a content rate of poly(3-hexyl thiophene) (P3HT) as the organic semiconductor material was 1 mass %, and a composition which was prepared by mixing the first solvent and the organic semiconductor material was used immediately after being prepared.

3. First Solvent Removing Step

Next, in a condition of 100° C.×10 minutes, a heat treatment was performed with respect to the liquid composition applied onto the source electrode, the drain electrode, and the substrate, and the first solvent was volatilized from the liquid composition.

4. Second Solvent Applying Step

Next, anisole as a second solvent was selectively applied onto a region (a portion in which the organic semiconductor material in a dried state existed) of the substrate having the liquid composition applied thereto by an ink jet method. Accordingly, the organic semiconductor material was dissolved in the second solvent.

5. Second Solvent Removing Step

Next, in a condition of 80° C.×10 minutes, a heat treatment was performed, and thus the second solvent was volatilized. Accordingly, an organic semiconductor film configured of the organic semiconductor material was formed on the source electrode, the drain electrode, and the substrate.

6. Gate Insulating Layer Forming Step

Next, a coating liquid containing a cycloolefin polymer was applied onto the organic semiconductor film by a spin casting method. Furthermore, the spin casting method was performed in a condition of slope for 1 second-2000 rpm for 60 seconds-slope for 2 seconds. After applying the coating liquid, a cycloolefin polymer film was dried at 60° C. for 10 minutes. Accordingly, a gate insulating layer including the cycloolefin polymer having a film thickness of 500 nm was formed.

The coating liquid containing a cycloolefin polymer was used by being adjusted as follows. First, a cycloolefin polymer (manufactured by Zeon Corporation, ZEONEX330R) (Tg: 123° C., a water absorption coefficient: 0.01%, and a refractive modulus: 1.509) was dissolved in octane to have a concentration of 5 mass %. Furthermore, the cycloolefin polymer was dissolved in octane by being subjected to a heat treatment in a condition of 80° C.×1 hour. After dissolving the cycloolefin polymer in octane, the dissolved cycloolefin polymer was returned to room temperature, and then was filtered by using a filter of 0.2 μm. Accordingly, the coating liquid containing a cycloolefin polymer was obtained.

7. Receiving Layer Forming Step

A polyvinyl phenol solution was applied onto the gate insulating layer by using a spin casting method. Furthermore, as the polyvinyl phenol solution, a solution which was prepared by dissolving polyvinyl phenol in isopropyl alcohol to have a concentration of 0.5 mass % was used. In addition, a condition of the spin casting method was identical to the condition described above.

After applying the solution, isopropyl alcohol was removed by a heat treatment in a condition of 60° C.×5 minutes, and a receiving layer (a thickness: 10 nm) configured of polyvinyl phenol was obtained.

8. Gate Electrode Forming Step

Finally, silver colloid ink was applied onto the gate insulating layer by an ink jet method, and a gate electrode was patterned. After patterning the gate electrode, the gate electrode was calcined at 80° C. for 10 minutes. Accordingly, the gate electrode including silver as a constitutional material was obtained.

As described above, a semiconductor device as illustrated in FIGS. 2A and 2B was obtained. Furthermore, a channel width of the semiconductor device was 1000 μm, and a channel length thereof was 10 μm.

In addition, in the liquid composition applying step, a semiconductor device was manufactured by the same method as the method described above except that a liquid composition which was contained in an airtight container immediately after being prepared, and was preserved for 3 days under an environment of 25° C. was used as the liquid composition.

Example 2

A semiconductor device was manufactured by the same method as that in Example 1 except that the configuration of the liquid composition and the second solvent was changed as shown in Table 1.

Example 3

A semiconductor device was manufactured by the same method as that in Example 1 except that the second solvent applying step was performed by exposing a base material having the liquid composition applied thereto into an atmosphere including the second solvent in a vaporized state. In the second solvent applying step, a temperature of the atmosphere was adjusted to 25° C., and a content of the second solvent in the atmosphere was adjusted to 22 $g/m^3$.

Example 4

A semiconductor device was manufactured by the same method as that in Example 3 except that the configuration of the liquid composition and the second solvent was changed as shown in Table 1.

Comparative Example 1

A semiconductor device was manufactured by the same method as that in Example 1 except that the second solvent applying step and the second solvent removing step were omitted.

Comparative Example 2

A semiconductor device was manufactured by the same method as that in Comparative Example 1 except that anisole was used as the solvent configuring the liquid composition.

Comparative Example 3

A semiconductor device was manufactured by the same method as that in Example 1 except that anisole was used as the solvent configuring the liquid composition, and xylene was used as the solvent used in the second solvent applying step.

Manufacturing conditions of each example and each comparative example are collectively shown in Table 1. Furthermore, in Table 1, a section for a second virial coefficient of the first solvent indicates a second virial coefficient of the first solvent with respect to the organic semiconductor material at 25° C., and a section for a second virial coefficient of the second solvent indicates a second virial coefficient of the second solvent with respect to the organic semiconductor material 25° C. In addition, a section of an applied amount of the second solvent indicates an applied amount of the second solvent with respect to 1 g of the organic semiconductor material on the base material. In addition, a section for an applying method of the second solvent indicates a method of applying the second solvent by attaching liquid droplets of the second solvent onto the base material having the liquid composition applied thereto as "liquid droplet attachment", and indicates a method of applying the second solvent by exposing the base material having the liquid composition applied thereto into an atmosphere including the second solvent in a vaporized state as "atmosphere exposure".

TABLE 1

| Sample No. | Preservation | First Solvent (Annealing Temperature) | First Solvent Second Virial Coefficient ($cm^3mol/g^2$) | Second Solvent (Annealing Temperature) | Second Solvent Second Virial Coefficient ($cm^3mol/g^2$) | Applied Amount/Applying Method | Drain Current ($\mu A$) |
|---|---|---|---|---|---|---|---|
| Example 1 | Immediately after Adjustment | Xylene (100° C.) | $5 \times 10^{-4}$ | Anisole (80° C.) | $-2 \times 10^{-4}$ | 100 g/Liquid Droplet Attachment | 4.3 |
| Example 1-2 | after 3 Days | Xylene (100° C.) | $5 \times 10^{-4}$ | Anisole (80° C.) | $-2 \times 10^{-4}$ | 100 g/Liquid Droplet Attachment | 4.1 |
| Example 2 | Immediately after Adjustment | Xylene (100° C.) | $5 \times 10^{-4}$ | Dichloromethane (80° C.) | $-1 \times 10^{-4}$ | 100 g/Liquid Droplet Attachment | 1.8 |
| Example 3 | Immediately after Adjustment | Xylene (100° C.) | $5 \times 10^{-4}$ | Anisole Atmosphere (80° C.) | $-2 \times 10^{-4}$ | 5 g/Atmosphere Exposure | 3.1 |
| Example 4 | Immediately after Adjustment | Xylene (100° C.) | $5 \times 10^{-4}$ | Dichloromethane Atmosphere (80° C.) | $-1 \times 10^{-4}$ | 5 g/Atmosphere Exposure | 0.9 |
| Comparative Example 1 | Immediately after Adjustment | Xylene (100° C.) | $5 \times 10^{-4}$ | — | — | — | 0.6 |
| Comparative Example 2 | Immediately after Adjustment (Midway Precipitation) | Anisole (80° C.) | $-2 \times 10^{-4}$ | — | — | — | 0.2 |
| Comparative Example 3 | Immediately after Adjustment (Midway Precipitation) | Anisole (80° C.) | $-2 \times 10^{-4}$ | Xylene (100° C.) | $5 \times 10^{-4}$ | 100 g/Liquid Droplet Attachment | 0.3 |

2. Evaluation of Semiconductor Properties

Transfer properties of the semiconductor device (the semiconductor device manufactured by using the liquid composition immediately after being prepared, and the semiconductor device manufactured by using the liquid composition which was preserved for 3 days under an environment of 25° C. after being prepared) obtained by each example and each comparative example were measured by using a semiconductor parameter analyzer (manufactured by Agilent Technologies: 4156C).

A drain current was measured in a measurement condition where a drain voltage of −40 V was applied and a gate voltage of +−40 V was applied in the atmosphere.

3. Evaluation of Preservation Stability of Liquid Composition

The liquid composition (the liquid composition including the organic semiconductor material) used in each example and each comparative example was placed for 90 days under an environment of 25° C. After that, the state of the liquid composition was visually observed, and was evaluated according to the following evaluation criteria.

A: In the liquid, precipitation and aggregation of a solid content was not confirmed at all.
B: In the liquid, precipitation and aggregation of a solid content was rarely confirmed.
C: In the liquid, precipitation and aggregation of a solid content was slightly confirmed.
D: In the liquid, precipitation and aggregation of a solid content was obviously confirmed.
E: In the liquid, precipitation and aggregation of a solid content was remarkably confirmed.

Results thereof are shown in Table 2.

TABLE 2

| Solvent | after Preservation for 90 Days |
|---|---|
| Xylene | B |
| Anisole | D |
| Dichloromethane | D |

As it is obvious from Table 1, the semiconductor device of the invention had excellent semiconductor properties. In addition, in the invention, it is found that the liquid composition has excellent preservation stability, and thus the organic semiconductor film is able to be stably manufactured over a long period of time. In contrast, in each comparative example, satisfactory results were not obtained.

The entire disclosure of Japanese Patent Application No. 2014-039973, filed Feb. 28, 2014 is expressly incorporated by reference herein.

What is claimed is:

1. A manufacturing method of an organic semiconductor film, comprising:
    applying a liquid composition in which an organic semiconductor material is dissolved or dispersed in a first solvent onto a base material in a predetermined pattern;
    removing the first solvent;
    applying, after the removing of the first solvent, a second solvent in which solubility of the organic semiconductor material is lower than that in the first solvent into a region of the base material having the liquid composition applied thereto; and
    removing the second solvent.

2. The manufacturing method of an organic semiconductor film according to claim 1,
    wherein the organic semiconductor material is a polymer.

3. The manufacturing method of an organic semiconductor film according to claim 1,
    wherein the applying the second solvent is performed by attaching liquid droplets of the second solvent onto the base material having the liquid composition applied thereto.

4. The manufacturing method of an organic semiconductor film according to claim 1,
    wherein the applying the second solvent is performed by exposing the base material having the liquid composition applied thereto into an atmosphere including the second solvent in a vaporized state.

5. The manufacturing method of an organic semiconductor film according to claim 1,
    wherein a second virial coefficient of the first solvent with respect to the organic semiconductor material at 25° C.

is a positive value, and a second virial coefficient of the second solvent with respect to the organic semiconductor material at 25° C. is a negative value.

6. The manufacturing method of an organic semiconductor film according to claim 1,
wherein an applied amount of the second solvent with respect to 1 g of the organic semiconductor material is greater than or equal to 10 g and less than or equal to 10000 g.

7. The manufacturing method of an organic semiconductor film according to claim 1,
wherein the organic semiconductor material is one or more selected from a group consisting of materials having a thiophene ring such as polythiophene, polyhexyl thiophene, and a fluorene-bithiophene copolymer, poly(p-phenylene vinylene), polythienylene vinylene, polyarylamine, a pyrene formaldehyde resin, an ethyl carbazole formaldehyde resin, a fluorene-arylamine copolymer, and derivatives thereof.

8. The manufacturing method of an organic semiconductor film according to claim 1,
wherein the first solvent is one or more selected from a group consisting of decalin, mesitylene, trimethylbenzene, cyclohexane, toluene, hexadecane, xylene (3.6), dodecane, tetralin, decane, octane, heptane, trichloroethane, tetrahydronaphthalene, chlorobenzene, and chloroform.

9. The manufacturing method of an organic semiconductor film according to claim 1,
wherein the second solvent is one or more selected from a group consisting of cyclohexanone, 1,4-dioxane, methyl naphthalene, dichlorobenzene, dichloromethane, tetrahydrofuran (THF), butane, anisole, and butyl acetate.

10. An organic semiconductor film manufactured by using the method according to claim 1.

11. An organic semiconductor film manufactured by using the method according to claim 2.

12. An organic semiconductor film manufactured by using the method according to claim 3.

13. An organic semiconductor film manufactured by using the method according to claim 4.

14. An organic semiconductor film manufactured by using the method according to claim 5.

15. A thin film transistor comprising the organic semiconductor film according to claim 10.

16. An active matrix device comprising the organic semiconductor film according to claim 10.

17. An electro-optical device comprising the organic semiconductor film according to claim 10.

18. An electronic device comprising the organic semiconductor film according To claim 10.

19. A manufacturing method of an organic semiconductor film, comprising:
applying a liquid composition in which an organic semiconductor material is dissolved or dispersed in a first solvent onto a base material in a predetermined pattern;
applying a second solvent in which solubility of the organic semiconductor material is lower than that in the first solvent into a region of the base material having the liquid composition applied thereto; and
removing the second solvent,
wherein the applying the second solvent is performed by attaching liquid droplets of the second solvent onto the base material having the liquid composition applied thereto.

20. A manufacturing method of an organic semiconductor film, comprising:
applying a liquid composition in which an organic semiconductor material is dissolved or dispersed in a first solvent onto a base material in a predetermined pattern;
applying a second solvent in which solubility of the organic semiconductor material is lower than that in the first solvent into a region of the base material having the liquid composition applied thereto; and
removing the second solvent,
wherein the applying the second solvent is performed by exposing the base material having the liquid composition applied thereto into an atmosphere including the second solvent in a vaporized state.

21. A manufacturing method of an organic semiconductor film, comprising:
applying a liquid composition in which an organic semiconductor material is dissolved or dispersed in a first solvent onto a base material in a predetermined pattern;
applying a second solvent in which solubility of the organic semiconductor material is lower than that in the first solvent into a region of the base material having the liquid composition applied thereto; and
removing the second solvent,
wherein a second virial coefficient of the first solvent with respect to the organic semiconductor material at 25° C. is a positive value, and a second virial coefficient of the second solvent with respect to the organic semiconductor material at 25° C. is a negative value.

22. A manufacturing method of an organic semiconductor film, comprising:
applying a liquid composition in which an organic semiconductor material is dissolved or dispersed in a first solvent onto a base material in a predetermined pattern;
applying a second solvent in which solubility of the organic semiconductor material is lower than that in the first solvent into a region of the base material having the liquid composition applied thereto; and
removing the second solvent,
wherein an applied amount of the second solvent with respect to 1 g of the organic semiconductor material is greater than or equal to 10 g and less than or equal to 10000 g.

* * * * *